(12) United States Patent
de Groot et al.

(10) Patent No.: US 7,855,826 B2
(45) Date of Patent: Dec. 21, 2010

(54) METHOD AND APPARATUS TO REDUCE OR ELIMINATE STICTION AND IMAGE RETENTION IN INTERFEROMETRIC MODULATOR DEVICES

(75) Inventors: Wilhelmus A. de Groot, Palo Alto, CA (US); Sauri Gudlavaleti, San Jose, CA (US); Yeh-Jiun Tung, Sunnyvale, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 248 days.

(21) Appl. No.: 12/190,407

(22) Filed: Aug. 12, 2008

(65) Prior Publication Data

US 2010/0039696 A1 Feb. 18, 2010

(51) Int. Cl.
*G02B 26/00* (2006.01)
*G09G 3/20* (2006.01)

(52) U.S. Cl. .................... 359/291; 359/298; 359/224.1; 345/55

(58) Field of Classification Search ......... 359/290–295, 359/298, 224.1; 345/55, 173; 427/162
See application file for complete search history.

(56) References Cited

U.S. PATENT DOCUMENTS

| 3,247,392 | A | 4/1966 | Thelen |
|---|---|---|---|
| 3,728,030 | A | 4/1973 | Hawes |
| 3,955,190 | A | 5/1976 | Teraishi |
| 4,403,248 | A | 9/1983 | te Velde |
| 4,441,789 | A | 4/1984 | Pohlack |
| 4,441,791 | A | 4/1984 | Hornbeck |
| 4,560,435 | A | 12/1985 | Brown et al. |
| 4,655,554 | A | 4/1987 | Armitage |
| 4,786,128 | A | 11/1988 | Birnbach |
| 4,859,060 | A | 8/1989 | Katagiri et al. |
| 4,925,259 | A | 5/1990 | Emmett |
| 4,954,789 | A | 9/1990 | Sampsell |
| 4,956,619 | A | 9/1990 | Hornbeck |
| 4,973,131 | A | 11/1990 | Carnes |

(Continued)

FOREIGN PATENT DOCUMENTS

EP 0 668 490 8/1995

(Continued)

OTHER PUBLICATIONS

Pape et al., Characteristics of the deformable mirror device for optical information processing, Optical Engineering, 22(6):676-681, Nov.-Dec. 1983.

(Continued)

*Primary Examiner*—Loha Ben
(74) *Attorney, Agent, or Firm*—Knobbe, Martens, Olson & Bear LLP

(57) ABSTRACT

Method and apparatus to reduce or eliminate stiction and image retention in interferometric display devices are disclosed. In some embodiments, a display element comprises a plurality of interferometric modulator devices configured in a matrix, each interferometric modulator device having a movable reflective layer and a plurality of supporting posts, the plurality of posts defining a post spacing distance in at least one direction that is greater for one or more interferometric modulator devices disposed adjacent to an edge of the display element than one or more interferometric modulator devices disposed nonadjacent to an edge of the display element.

21 Claims, 13 Drawing Sheets

U.S. PATENT DOCUMENTS

| | | |
|---|---|---|
| 4,982,184 A | 1/1991 | Kirkwood |
| 5,022,745 A | 6/1991 | Zahowski et al. |
| 5,028,939 A | 7/1991 | Hornbeck et al. |
| 5,062,689 A | 11/1991 | Koehler |
| 5,091,983 A | 2/1992 | Lukosz |
| 5,096,279 A | 3/1992 | Hornbeck et al. |
| 5,170,283 A | 12/1992 | O'Brien et al. |
| 5,315,370 A | 5/1994 | Bulow |
| 5,381,232 A | 1/1995 | Van Wijk |
| 5,452,138 A | 9/1995 | Mignardi et al. |
| 5,471,341 A | 11/1995 | Warde et al. |
| 5,526,172 A | 6/1996 | Kanack |
| 5,559,358 A | 9/1996 | Burns et al. |
| 5,561,523 A | 10/1996 | Blomberg et al. |
| 5,636,052 A | 6/1997 | Arney et al. |
| 5,646,729 A | 7/1997 | Koskinen et al. |
| 5,646,768 A | 7/1997 | Kaeriyama |
| 5,661,592 A | 8/1997 | Bornstein et al. |
| 5,665,997 A | 9/1997 | Weaver et al. |
| 5,699,181 A | 12/1997 | Choi |
| 5,710,656 A | 1/1998 | Goosen |
| 5,719,068 A | 2/1998 | Suzawa et al. |
| 5,734,177 A | 3/1998 | Sakamoto |
| 5,786,927 A | 7/1998 | Greywall et al. |
| 5,808,781 A | 9/1998 | Arney et al. |
| 5,818,095 A | 10/1998 | Sampsell |
| 5,825,528 A | 10/1998 | Goosen |
| 5,838,484 A | 11/1998 | Goossen et al. |
| 5,867,302 A | 2/1999 | Fleming |
| 5,914,804 A | 6/1999 | Goossen |
| 5,920,418 A | 7/1999 | Shiono et al. |
| 5,961,848 A | 10/1999 | Jacquet et al. |
| 6,028,689 A | 2/2000 | Michalicek et al. |
| 6,040,937 A | 3/2000 | Miles |
| 6,046,659 A | 4/2000 | Loo et al. |
| 6,055,090 A | 4/2000 | Miles |
| 6,100,861 A | 8/2000 | Cohen et al. |
| 6,242,932 B1 | 6/2001 | Hembree |
| 6,262,697 B1 | 7/2001 | Stephenson |
| 6,327,071 B1 | 12/2001 | Kimura |
| 6,335,235 B1 | 1/2002 | Bhekta et al. |
| 6,356,378 B1 | 3/2002 | Huibers |
| 6,384,952 B1 | 5/2002 | Clark et al. |
| 6,433,917 B1 | 8/2002 | Mei et al. |
| 6,438,282 B1 | 8/2002 | Takeda et al. |
| 6,452,712 B2 | 9/2002 | Atobe et al. |
| 6,466,354 B1 | 10/2002 | Gudeman |
| 6,556,338 B2 | 4/2003 | Han et al. |
| 6,574,033 B1 | 6/2003 | Chui et al. |
| 6,597,490 B2 | 7/2003 | Tayebati |
| 6,608,268 B1 | 8/2003 | Goldsmith |
| 6,632,698 B2 | 10/2003 | Ives |
| 6,650,455 B2 | 11/2003 | Miles |
| 6,657,832 B2 | 12/2003 | Williams et al. |
| 6,661,561 B2 | 12/2003 | Fitzpatrick et al. |
| 6,674,562 B1 | 1/2004 | Miles et al. |
| 6,680,792 B2 | 1/2004 | Miles |
| 6,698,295 B1 | 3/2004 | Sherrer |
| 6,710,908 B2 | 3/2004 | Miles et al. |
| 6,794,119 B2 | 9/2004 | Miles |
| 6,813,059 B2 | 11/2004 | Hunter et al. |
| 6,841,081 B2 | 1/2005 | Chang et al. |
| 6,844,959 B2 | 1/2005 | Huibers et al. |
| 6,862,127 B1 | 3/2005 | Ishii |
| 6,867,896 B2 | 3/2005 | Miles |
| 6,870,654 B2 | 3/2005 | Lin et al. |
| 6,882,458 B2 | 4/2005 | Lin et al. |
| 6,882,461 B1 | 4/2005 | Tsai et al. |
| 6,912,022 B2 | 6/2005 | Lin et al. |
| 6,940,630 B2 | 9/2005 | Xie |
| 6,947,200 B2 | 9/2005 | Huibers |
| 6,952,303 B2 | 10/2005 | Lin et al. |
| 6,958,847 B2 | 10/2005 | Lin |
| 6,980,350 B2 | 12/2005 | Hung et al. |
| 6,982,820 B2 | 1/2006 | Tsai |
| 7,006,272 B2 | 2/2006 | Tsai |
| 7,027,204 B2 | 4/2006 | Trisnadi et al. |
| 7,034,981 B2 | 4/2006 | Makigaki |
| 7,046,422 B2 | 5/2006 | Kimura et al. |
| 7,119,945 B2 | 10/2006 | Kothari et al. |
| 7,123,216 B1 | 10/2006 | Miles |
| 7,126,738 B2 | 10/2006 | Miles |
| 7,130,104 B2 | 10/2006 | Cummings |
| 7,184,195 B2 | 2/2007 | Yang |
| 7,184,202 B2 | 2/2007 | Miles et al. |
| 7,198,873 B2 | 4/2007 | Lin et al. |
| 7,221,495 B2 | 5/2007 | Miles et al. |
| 7,236,284 B2 | 6/2007 | Miles |
| 7,245,285 B2 | 7/2007 | Yeh et al. |
| 7,289,259 B2 | 10/2007 | Chui et al. |
| 7,302,157 B2 | 11/2007 | Chui |
| 7,321,456 B2 | 1/2008 | Cummings |
| 7,321,457 B2 | 1/2008 | Heald |
| 7,327,510 B2 | 2/2008 | Cummings et al. |
| 7,372,613 B2 | 5/2008 | Chui et al. |
| 7,372,619 B2 | 5/2008 | Miles |
| 7,385,744 B2 | 6/2008 | Kogut et al. |
| 7,385,762 B2 | 6/2008 | Cummings |
| 7,400,488 B2 | 7/2008 | Lynch et al. |
| 7,420,725 B2 | 9/2008 | Kothari |
| 7,436,573 B2 | 10/2008 | Doan et al. |
| 7,612,933 B2 | 11/2009 | Djordjev |
| 7,629,197 B2 | 12/2009 | Luo et al. |
| 2001/0003487 A1 | 6/2001 | Miles |
| 2001/0028503 A1 | 10/2001 | Flanders et al. |
| 2001/0043171 A1 | 11/2001 | Van Gorkom et al. |
| 2002/0054424 A1 | 5/2002 | Miles |
| 2002/0070931 A1 | 6/2002 | Ishikawa |
| 2002/0075555 A1 | 6/2002 | Miles |
| 2002/0126364 A1 | 9/2002 | Miles |
| 2002/0146200 A1 | 10/2002 | Kurdle et al. |
| 2002/0149828 A1 | 10/2002 | Miles |
| 2002/0154422 A1 | 10/2002 | Sniegowski et al. |
| 2003/0016428 A1 | 1/2003 | Kato et al. |
| 2003/0035196 A1 | 2/2003 | Walker |
| 2003/0043157 A1 | 3/2003 | Miles |
| 2003/0053078 A1 | 3/2003 | Missey et al. |
| 2003/0119221 A1 | 6/2003 | Cunningham et al. |
| 2003/0138669 A1 | 7/2003 | Kojima et al. |
| 2003/0202265 A1 | 10/2003 | Reboa et al. |
| 2003/0202266 A1 | 10/2003 | Ring et al. |
| 2004/0008396 A1 | 1/2004 | Stappaerts |
| 2004/0008438 A1 | 1/2004 | Sato |
| 2004/0027671 A1 | 2/2004 | Wu et al. |
| 2004/0027701 A1 | 2/2004 | Ishikawa |
| 2004/0043552 A1 | 3/2004 | Strumpell et al. |
| 2004/0051929 A1 | 3/2004 | Sampsell et al. |
| 2004/0058532 A1 | 3/2004 | Miles et al. |
| 2004/0075967 A1 | 4/2004 | Lynch et al. |
| 2004/0076802 A1 | 4/2004 | Tompkin et al. |
| 2004/0080035 A1 | 4/2004 | Delapierre |
| 2004/0100594 A1 | 5/2004 | Huibers et al. |
| 2004/0100677 A1 | 5/2004 | Huibers et al. |
| 2004/0125281 A1 | 7/2004 | Lin et al. |
| 2004/0125282 A1 | 7/2004 | Lin et al. |
| 2004/0145811 A1 | 7/2004 | Lin et al. |
| 2004/0147198 A1 | 7/2004 | Lin et al. |
| 2004/0175577 A1 | 9/2004 | Lin et al. |
| 2004/0184134 A1 | 9/2004 | Makigaki |
| 2004/0207897 A1 | 10/2004 | Lin |
| 2004/0209195 A1 | 10/2004 | Lin |
| 2004/0217919 A1 | 11/2004 | Piehl et al. |
| 2004/0218251 A1 | 11/2004 | Piehl et al. |
| 2004/0240032 A1 | 12/2004 | Miles |

| | | |
|---|---|---|
| 2005/0002082 A1 | 1/2005 | Miles |
| 2005/0003667 A1 | 1/2005 | Lin et al. |
| 2005/0024557 A1 | 2/2005 | Lin |
| 2005/0035699 A1 | 2/2005 | Tsai |
| 2005/0036095 A1 | 2/2005 | Yeh et al. |
| 2005/0046919 A1 | 3/2005 | Taguchi et al. |
| 2005/0046922 A1 | 3/2005 | Lin et al. |
| 2005/0046948 A1 | 3/2005 | Lin |
| 2005/0068627 A1 | 3/2005 | Nakamura et al. |
| 2005/0078348 A1 | 4/2005 | Lin |
| 2005/0168849 A1 | 8/2005 | Lin |
| 2005/0179378 A1 | 8/2005 | Oooka et al. |
| 2005/0195462 A1 | 9/2005 | Lin |
| 2005/0249966 A1 | 11/2005 | Tung et al. |
| 2006/0007517 A1 | 1/2006 | Tsai |
| 2006/0017379 A1 | 1/2006 | Su et al. |
| 2006/0017689 A1 | 1/2006 | Faase et al. |
| 2006/0024880 A1 | 2/2006 | Chui et al. |
| 2006/0065940 A1 | 3/2006 | Kothari |
| 2006/0066599 A1 | 3/2006 | Chui |
| 2006/0066640 A1 | 3/2006 | Kothari et al. |
| 2006/0066641 A1 | 3/2006 | Gally et al. |
| 2006/0066864 A1 | 3/2006 | Cummings et al. |
| 2006/0066936 A1 | 3/2006 | Chui et al. |
| 2006/0067649 A1 | 3/2006 | Tung et al. |
| 2006/0067651 A1 | 3/2006 | Chui |
| 2006/0077152 A1 | 4/2006 | Chui et al. |
| 2006/0077155 A1 | 4/2006 | Chui et al. |
| 2006/0077156 A1 | 4/2006 | Chui et al. |
| 2006/0079048 A1 | 4/2006 | Sampsell |
| 2006/0220160 A1 | 10/2006 | Miles |
| 2006/0262380 A1 | 11/2006 | Miles |
| 2006/0268388 A1 | 11/2006 | Miles |
| 2006/0274398 A1 | 12/2006 | Chou |
| 2007/0020948 A1 | 1/2007 | Piehl et al. |
| 2007/0077525 A1 | 4/2007 | Davis et al. |
| 2007/0086078 A1 | 4/2007 | Hagood et al. |
| 2007/0121118 A1 | 5/2007 | Gally et al. |
| 2007/0138608 A1 | 6/2007 | Ikehashi |
| 2007/0177247 A1 | 8/2007 | Miles |
| 2007/0194630 A1 | 8/2007 | Mingard et al. |
| 2007/0216987 A1 | 9/2007 | Hagood et al. |
| 2007/0279729 A1 | 12/2007 | Kothari et al. |
| 2007/0285761 A1 | 12/2007 | Zhong et al. |
| 2008/0002299 A1 | 1/2008 | Thurn |
| 2008/0013144 A1 | 1/2008 | Chui et al. |
| 2008/0013145 A1 | 1/2008 | Chui et al. |
| 2008/0013154 A1 | 1/2008 | Chui |
| 2008/0037093 A1 | 2/2008 | Miles |
| 2008/0055705 A1 | 3/2008 | Kothari |
| 2008/0055706 A1 | 3/2008 | Chui et al. |
| 2008/0055707 A1 | 3/2008 | Kogut et al. |
| 2008/0080043 A1 | 4/2008 | Chui et al. |
| 2008/0088904 A1 | 4/2008 | Miles |
| 2008/0088910 A1 | 4/2008 | Miles |
| 2008/0088911 A1 | 4/2008 | Miles |
| 2008/0088912 A1 | 4/2008 | Miles |
| 2008/0094690 A1 | 4/2008 | Luo et al. |
| 2008/0106782 A1 | 5/2008 | Miles |
| 2008/0110855 A1 | 5/2008 | Cummings |
| 2008/0112035 A1 | 5/2008 | Cummings |
| 2008/0112036 A1 | 5/2008 | Cummings |
| 2008/0186581 A1 | 8/2008 | Bita et al. |
| 2008/0239455 A1 | 10/2008 | Kogut et al. |
| 2008/0247028 A1 | 10/2008 | Chui et al. |
| 2008/0278787 A1 | 11/2008 | Sasagawa |
| 2008/0278788 A1 | 11/2008 | Sasagawa |
| 2008/0316566 A1 | 12/2008 | Lan |
| 2008/0316568 A1 | 12/2008 | Griffiths et al. |
| 2009/0009845 A1 | 1/2009 | Endisch et al. |
| 2009/0068781 A1 | 3/2009 | Tung et al. |
| 2009/0073534 A1 | 3/2009 | Lee et al. |
| 2009/0073539 A1 | 3/2009 | Mignard |
| 2009/0080060 A1 | 3/2009 | Sampsell et al. |
| 2009/0103166 A1 | 4/2009 | Khazeni et al. |
| 2009/0135465 A1 | 5/2009 | Chui |
| 2009/0147343 A1 | 6/2009 | Kogut et al. |
| 2009/0201566 A1 | 8/2009 | Kothari |
| 2009/0213450 A1 | 8/2009 | Sampsell |
| 2009/0213451 A1 | 8/2009 | Tung et al. |
| 2009/0225395 A1 | 9/2009 | Ganti et al. |
| 2009/0231666 A1 | 9/2009 | Gudlavalleti et al. |
| 2009/0251761 A1 | 10/2009 | Khazeni et al. |
| 2009/0256218 A1 | 10/2009 | Mignard et al. |
| 2009/0257105 A1 | 10/2009 | Xu et al. |
| 2009/0273823 A1 | 11/2009 | Tung et al. |
| 2009/0273824 A1 | 11/2009 | Sasagawa |
| 2009/0279162 A1 | 11/2009 | Chui |
| 2009/0323153 A1 | 12/2009 | Sampsell |
| 2009/0323165 A1 | 12/2009 | Sampsell |
| 2009/0323166 A1 | 12/2009 | Sampsell |
| 2010/0014148 A1 | 1/2010 | Djordjev |
| 2010/0039370 A1 | 2/2010 | Miles |
| 2010/0080890 A1 | 4/2010 | Tung et al. |
| 2010/0085626 A1 | 4/2010 | Tung et al. |
| 2010/0118382 A1 | 5/2010 | Kothari et al. |

FOREIGN PATENT DOCUMENTS

| | | |
|---|---|---|
| EP | 1 122 577 | 8/2001 |
| EP | 1 227 346 | 7/2002 |
| EP | 1 275 997 | 1/2003 |
| EP | 1 473 581 | 11/2004 |
| EP | 1 640 329 | 3/2006 |
| JP | 5-49238 | 2/1993 |
| JP | 5-281479 | 10/1993 |
| JP | 11211999 | 8/1999 |
| JP | 2002-062490 | 2/2000 |
| JP | 2001-221913 | 8/2001 |
| JP | 2002-221678 | 8/2002 |
| JP | 2003-340795 | 2/2003 |
| JP | 2004-012642 | 1/2004 |
| JP | 2004-212638 | 7/2004 |
| JP | 2004-212680 | 7/2004 |
| JP | 2005 279831 | 10/2005 |
| JP | 2005-308871 | 11/2005 |
| WO | WO 98/14804 | 4/1998 |
| WO | WO 02/086582 | 10/2002 |
| WO | WO 2007/022476 | 2/2007 |
| WO | WO 2007/036422 | 4/2007 |
| WO | WO 2007/053438 | 5/2007 |
| WO | WO 2007/072998 | 6/2007 |

OTHER PUBLICATIONS

Kowarz et al., Conformal grating electromechanical system (GEMS) for high-speed digital light modulation, Proceedings of the IEEE 15th. Annual International Conference on Micro Electro Mechanical Systems, MEMS 2002, pp. 568-573.

Miles, Interferometric modulation: MOEMS as an enabling technology for high performance reflective displays, Proceedings of SPIE, vol. 4985, pp. 131-139, 2003.

Conner, "Hybrid Color Display Using Optical Interference Filter Array," SID Digest, pp. 577-580 (1993).

Feenstra et al., Electrowetting displays, Liquivista BV, 16 pp., Jan. 2006.

Jerman et al., "A Miniature Fabry-Perot Interferometer with a Corrugated Silicon Diaphragm Support", (1988).

Jerman et al., "Miniature Fabry-Perot Interferometers Micromachined in Silicon for Use in Optical Fiber WDM Systems," Transducers, San Francisco, Jun. 24-27, 1991, Proceedings on the Int'l. Conf. on Solid State Sensors and Actuators, vol. CONF. 6, Jun. 24, 1991, pp. 372-375.

Lezec, Submicrometer dimple array based interference color field displays and sensors, Nano Lett. 7(2):329-333, Dec. 23, 2006.

Miles, A New Reflective FPD Technology Using Interferometric Modulation, Journal of the SID, 5/4, 1997.

Taii et al., "A transparent sheet display by plastic MEMS," Journal of the SID 14(8):735-741, 2006.

ISR and WO dated Oct. 20, 2009 for PCT/US09/053315.

Longhurst, 1963, Chapter IX: Multiple Beam Interferometry, in Geometrical and Physical Optics, pp. 153-157.

Tolansky, 1948, Chapter II: Multiple-Beam Interference, in Multiple-bean Interferometry of Surfaces and Films, Oxford at the Clarendon Press, pp. 8-11.

|  | Column Output Signals | |
|---|---|---|
|  | $+V_{bias}$ | $-V_{bias}$ |
| Row Output Signals — 0 | Stable | Stable |
| $+\Delta V$ | Relax | Actuate |
| $-\Delta V$ | Actuate | Relax |

METHOD AND APPARATUS TO REDUCE OR ELIMINATE STICTION AND IMAGE RETENTION IN INTERFEROMETRIC MODULATOR DEVICES

FIELD OF THE INVENTION

The field of the invention relates to microelectromechanical systems (MEMS).

DESCRIPTION OF RELATED TECHNOLOGY

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane (layer) separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF CERTAIN EMBODIMENTS

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display devices.

In one embodiment, a display element includes a plurality of interferometric modulator devices configured in a matrix forming a plurality of rows and columns, each interferometric modulator device comprising a movable reflective layer comprising two opposite rail edges that are each supported by a rail and two opposing free edges, and a plurality of posts configured to support the movable reflective layer, the plurality of posts being spaced apart to define post spacing distances between adjacent posts positioned along an axis parallel to one of the rails, wherein the post spacing distance between adjacent posts along the axis and closest to each free edge is smaller than the post spacing distance between a plurality of other adjacent posts along the axis. The post spacing distance between said plurality of other adjacent posts along the axis may be substantially the same. The post spacing distance between the adjacent posts along the axis and closest to each free edge may be substantially the same. In some embodiments, the post spacing distances between adjacent posts along the axis increase as the distance from one of the free edges increases. In some embodiments, the post spacing distance between the adjacent posts along the axis and closest to each free edge can be approximately 32 μm, and the post spacing distance between said plurality of other adjacent posts along the axis can be approximately 38 μm. In some embodiments, the post spacing distance between the adjacent posts along the axis and closest to each free edge maybe approximately 2-10 μm smaller than the post spacing distance between said plurality of other adjacent posts along the axis. In various embodiments, the defined post spacing distances minimize a voltage required to release the interferometric modulator device. The post spacing distances can be defined such that the at least one free edge of the movable layer has a higher stiffness than another portion of the movable layer that is not on the at least one free edge.

Embodiments of the invention can include a display that includes the plurality of interferometric modulator devices, a processor that is configured to communicate with said display, said processor being configured to process image data, and a memory device that is configured to communicate with said processor. They can further comprise a driver circuit configured to send at least one signal to said display. Embodiments may further include a controller configured to send at least a portion of said image data to said driver circuit, and also an image source module configured to send said image data to said processor. The image source module can include at least one of a receiver, transceiver, and transmitter.

Another embodiment includes a display element that includes a plurality of interferometric modulator devices configured in a matrix forming a plurality of rows and columns, each interferometric modulator device including a movable reflective layer comprising two opposite rail edges that are each supported by a rail and two opposing free edges, and a plurality of posts configured to support the movable reflective layer, the plurality of posts being spaced apart to define post spacing distances between adjacent posts positioned along an axis parallel to one of the rails, wherein an outer post spacing distance between two adjacent outer posts along the axis is smaller than an inner post spacing distance between two adjacent inner posts along the axis, where the outer posts are closer to a free edge than the inner posts. The post spacing distances between a plurality of adjacent inner posts along the axis can be substantially the same. The post spacing distance between the outer adjacent posts close to each free edge can be substantially the same. In some embodiments, the post spacing distances between adjacent inner posts along the axis increases as the distance from one of the free edges increases. Some embodiments have a post spacing distance between two adjacent outer posts along the axis and closest to each free edge defined as approximately 32 μm. In some embodiments, the post spacing distance between two adjacent inner posts along the axis is approximately 38 μm. The post spacing distance between two adjacent outer posts along the axis and closest to each free edge can be approximately 2-10 μm smaller than the post spacing distance between two adjacent inner posts along the axis.

Another embodiment includes a method of manufacturing an interferometric modulator, comprising forming posts configured to support a movable layer, the posts having a plurality of post spacing distances, the distances defining a stiffness of respective portions of the movable layer, wherein the post spacing distances are such that a portion on a free edge of the movable layer has a lower stiffness than another portion that is not on a free edge of the movable layer.

Another embodiment includes a method of changing the state of a display element comprising a plurality of rows of interferometric modulator devices (IMODs), each row comprising a plurality of IMODs, the method comprising releasing IMODs along a first free edge of the display element and along a second free edge of the display element, the first and second free edges being opposite edges of the display element; and releasing IMODs not along the first free edge or the second free edge substantially after initiating release of the IMODS along the first and second free edges. In one aspect of this embodiment releasing the IMODs not along the first or second free edges comprises releasing substantially all IMODS not along the first or second free edges at substantially the same time. In another aspect, a first IMOD is released substantially before a second IMOD located nearer an area equidistant from the first and second free edges than the first IMOD.

DETAILED DESCRIPTION OF CERTAIN EMBODIMENTS

Figure 1:
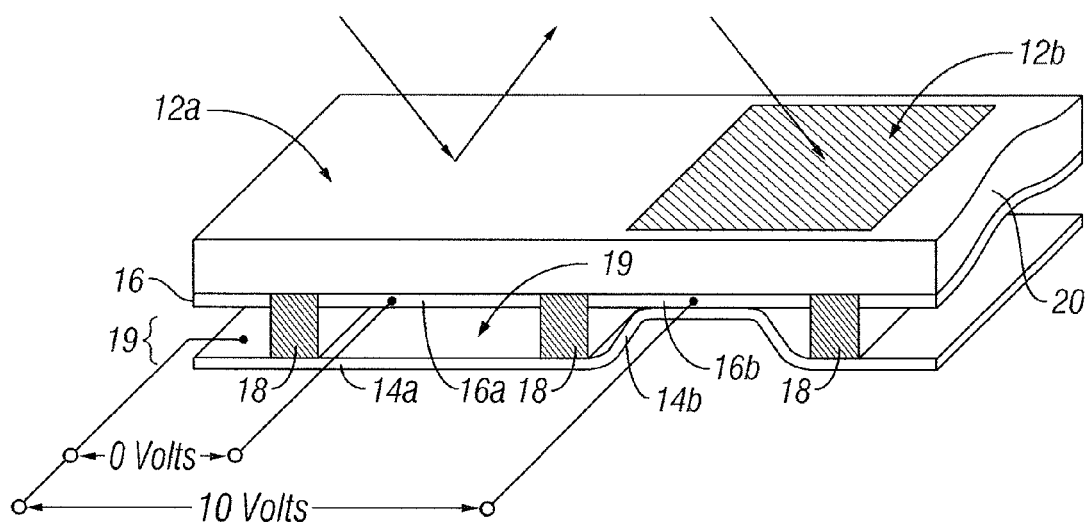
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

The following detailed description is directed to certain specific embodiments. However, the teachings herein can be applied in a multitude of different ways. In this description, reference is made to the drawings wherein like parts are typically designated with like numerals throughout. The embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., an odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

MEMS devices can suffer from both manufacturing yield loss and reliability fallout as a result of conditions known as "stiction" and/or "image retention." Stiction describes a condition where a movable reflective layer of the MEMS device becomes stuck in a certain position (e.g., actuated) due to adhesion factors. Image retention occurs when a movable layer of the MEMS device becomes stuck when displaying a stationary image for a longer period of time, which can be due to several factors including stiction. These conditions can limit the use of MEMS devices in low use display applications where the displayed data content is not often changed. Layer stress and relaxation factors contribute to stiction and image retention. The restoring force resulting from tension and stiffness of the movable layer is one factor that contributes to releasing an actuated movable layer. Embodiments of the invention allow targeted sections of a display element (or pixel) to have a higher stiffness than other sections, thus affecting the release of the movable layer from an actuated position. In some embodiments, the structural support features (e.g., posts) that support the movable layer are placed in positions to increase stiffness near a free edge of the pixel. Stiffness of the movable layer can be increased by decreasing the spacing between the posts. Because the movable layer releases (usually) starting at the pixel edge, having a higher stiffness at the edge of the pixel facilitates the release process. Similarly, image retention can be caused by "aging" of the device and results in deformation of high stress areas of the movable layer. Selected post spacing in certain areas of the pixel can increase the layer stiffness near edges of the pixel and reduce layer bending in lower stiffness areas near center posts of the display element, thus reducing the aging effect and lowering image retention. Other anti-stiction techniques, for example, surface roughening, relief features and anti-stiction coatings, can be used in conjunction with varied post spacing and any of the embodiments described herein to decrease and/or eliminate stiction and prevent image retention.

One interferometric modulator display embodiment comprising an interferometric MEMS display element is illustrated in FIG. 1. In these devices, the pixels are in either a bright or dark state. In the bright ("relaxed" or "open") state, the display element reflects a large portion of incident visible light to a user. When in the dark ("actuated" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) to form columns deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device. Note that FIG. 1 may not be to scale. In some embodiments, the spacing between posts 18 may be on the order of 10-100 um, while the gap 19 may be on the order of <1000 Angstroms.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential (voltage) difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by actuated pixel 12b on the right in FIG. 1. The behavior is the same regardless of the polarity of the applied potential difference.

FIGS. 2 through 5 illustrate one exemplary process and system for using an array of interferometric modulators in a display application.

Figure 2:
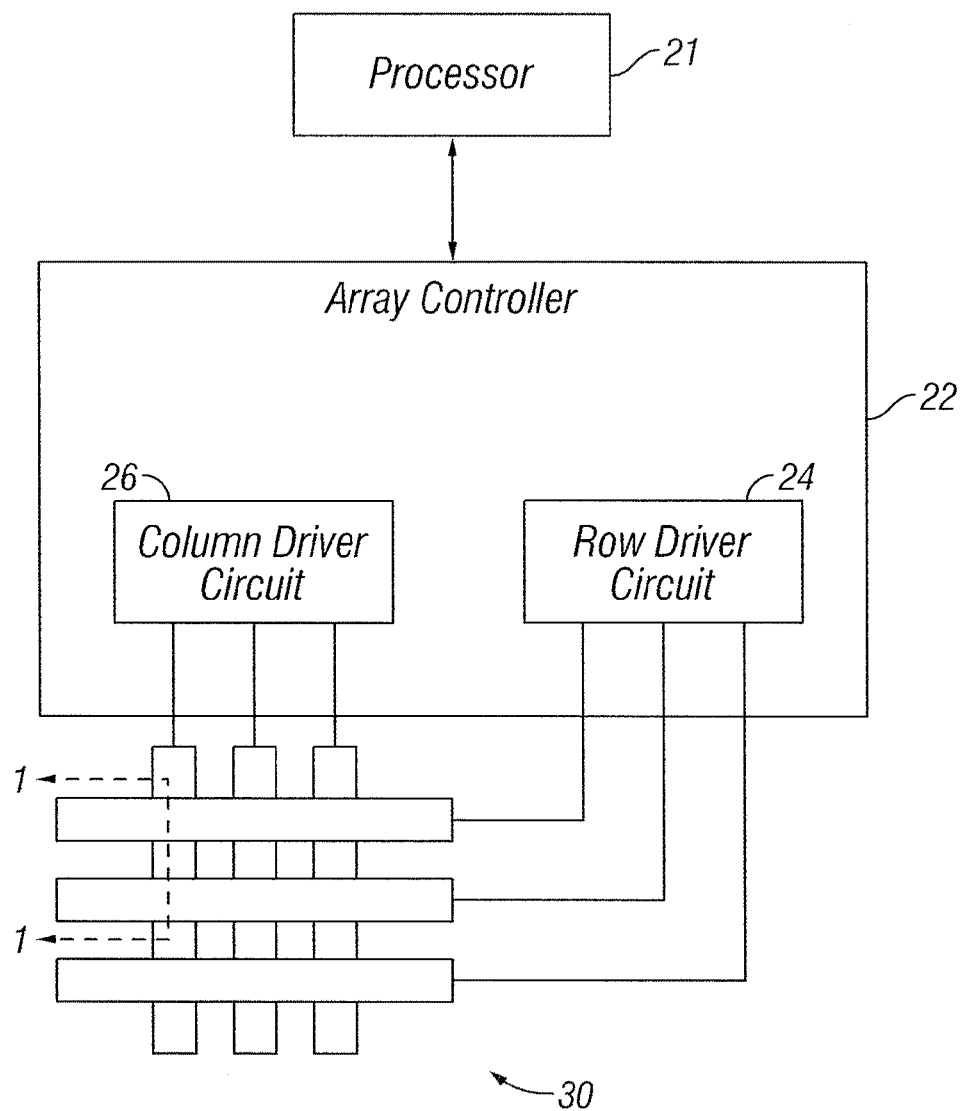
FIG. 2 is a system block diagram illustrating one embodiment of an electronic device incorporating a 3×3 interferometric modulator display.

FIG. 2 is a system block diagram illustrating one embodiment of an electronic device that may incorporate interferometric modulators. The electronic device includes a processor 21 which may be any general purpose single- or multi-chip microprocessor such as an ARM®, Pentium®, 8051, MIPS®, Power PC®, or ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. Note that although FIG. 2 illustrates a 3×3 array of interferometric modulators for the sake of clarity, the display array 30 may contain a very large number of interferometric modulators, and may have a different number of interferometric modulators in rows than in columns (e.g., 300 pixels per row by 190 pixels per column).

Figures 3, 4:
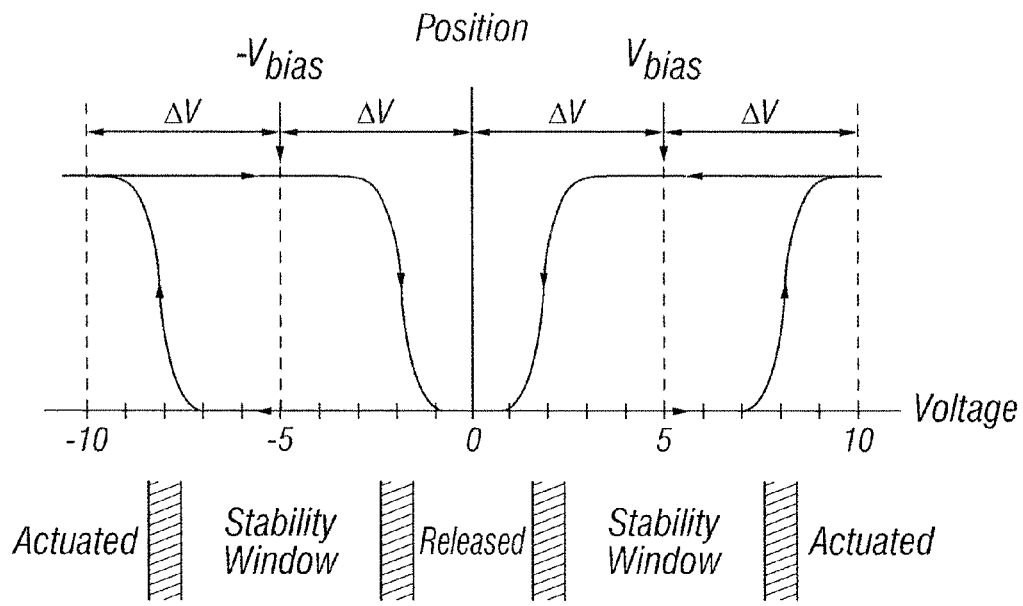
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIG. 3 is a diagram of movable mirror position versus applied voltage for one exemplary embodiment of an interferometric modulator of FIG. 1. For MEMS interferometric modulators, the row/column actuation protocol may take advantage of a hysteresis property of these devices as illustrated in FIG. 3. An interferometric modulator may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volt. After the strobe, the pixels are exposed to a steady state or bias voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

As described further below, in typical applications, a frame of an image may be created by sending a set of data signals (each having a certain voltage level) across the set of column electrodes in accordance with the desired set of actuated pixels in the first row. A row pulse is then applied to a first row electrode, actuating the pixels corresponding to the set of data signals. The set of data signals is then changed to correspond to the desired set of actuated pixels in a second row. A pulse is then applied to the second row electrode, actuating the appropriate pixels in the second row in accordance with the data signals. The first row of pixels are unaffected by the second row pulse, and remain in the state they were set to during the first row pulse. This may be repeated for the entire series of rows in a sequential fashion to produce the frame. Generally, the frames are refreshed and/or updated with new image data by continually repeating this process at some desired number of frames per second. A wide variety of protocols for driving row and column electrodes of pixel arrays to produce image frames may be used.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively. Relaxing the pixel is accomplished by setting the appropriate column to $+V_{bias}$, and the appropriate row to the same $+\Delta V$, producing a zero volt potential difference across the pixel. In those rows where the row voltage is held at zero volt, the pixels are stable in whatever state they were originally in, regardless of whether the column is at $+V_{bias}$, or $-V_{bias}$. As is also illustrated in FIG. 4, voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

Figure 5A:
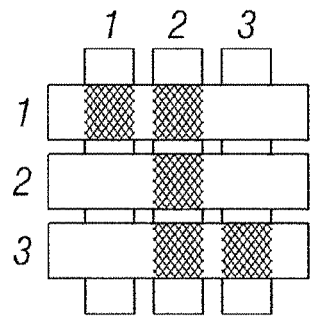
FIGS. 5A and 5B illustrate one exemplary timing diagram for row and column signals that may be used to write a frame of display data to the 3×3 interferometric modulator display of FIG. 2.
Figure 5B:
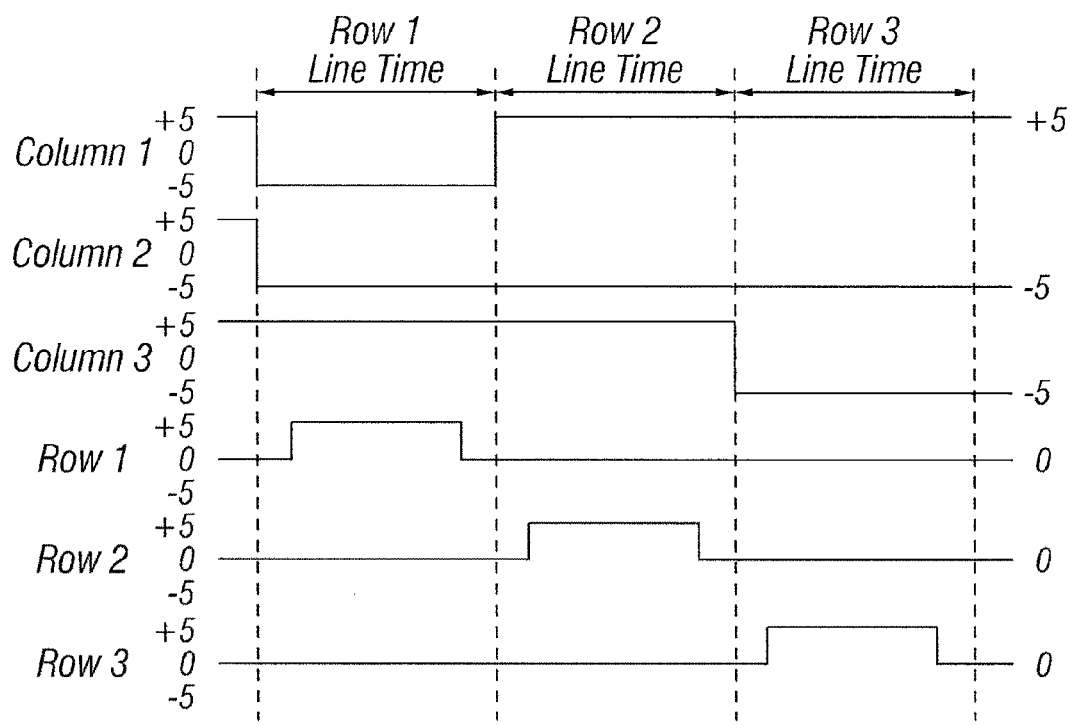

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are initially at 0 volt, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. The same procedure can be employed for arrays of dozens or hundreds of rows and columns. The timing, sequence, and levels of voltages used to perform row and column actuation can be varied widely within the general principles outlined above, and the above example is exemplary only, and any actuation voltage method can be used with the systems and methods described herein.

Figure 6A:
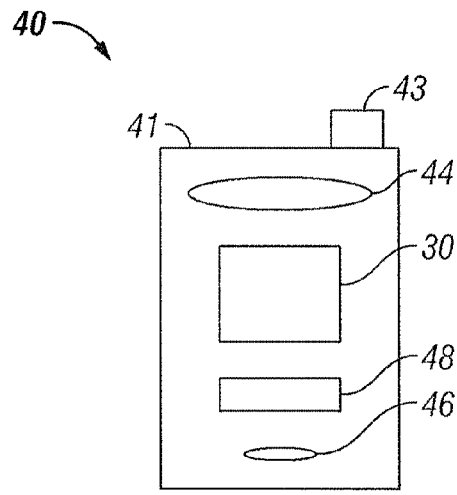
FIGS. 6A and 6B are system block diagrams illustrating an embodiment of a visual display device comprising a plurality of interferometric modulators.
Figure 6B:
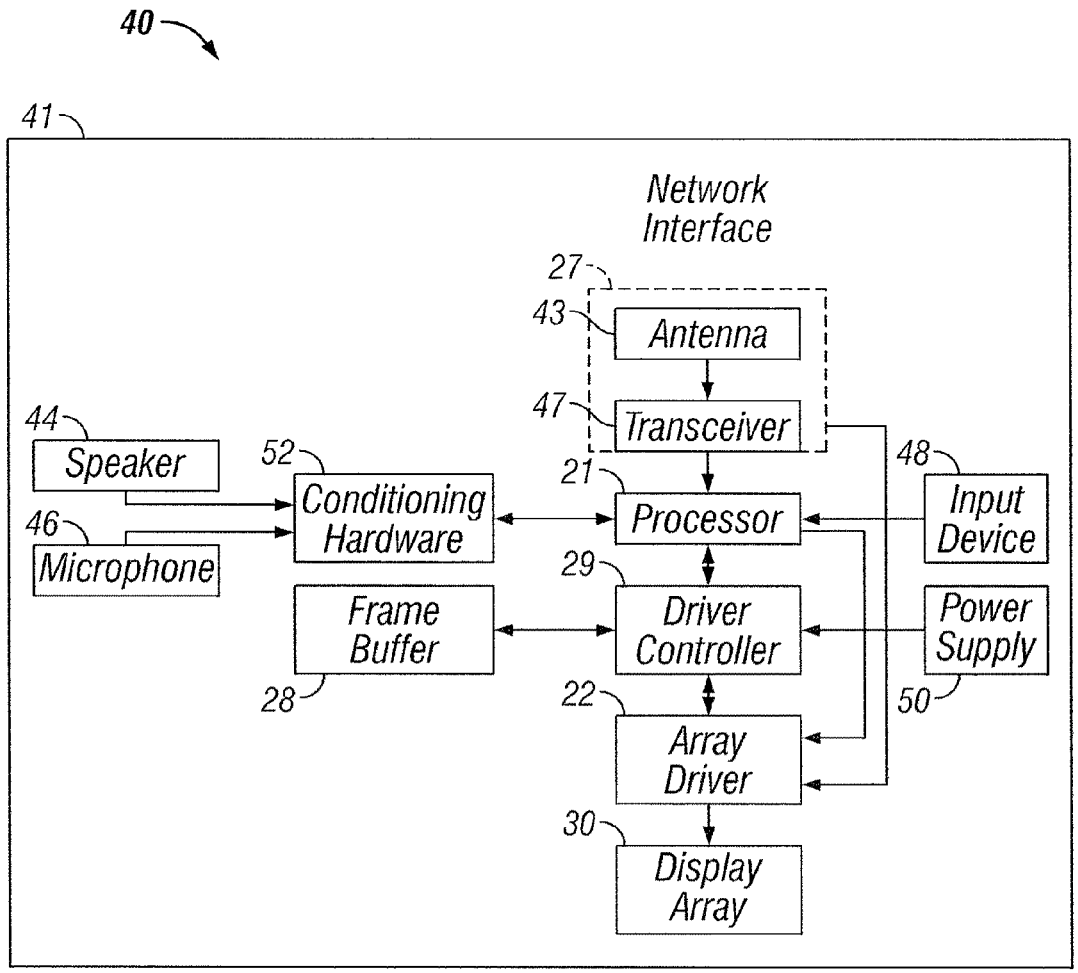

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one ore more devices over a network. In one embodiment the network interface 27 may also have some processing capabilities to relieve requirements of the processor 21. The antenna 43 is any antenna for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, W-CDMA, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device b allows a user to control the operation of the exemplary display device 40. In one embodiment, input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell, including a plastic solar cell, and solar-cell paint. In another embodiment, power supply 50 is configured to receive power from a wall outlet.

In some implementations control programmability resides, as described above, in a driver controller which can be located in several places in the electronic display system. In some cases control programmability resides in the array driver 22. The above-described optimization may be implemented in any number of hardware and/or software components and in various configurations.

Figure 7A:
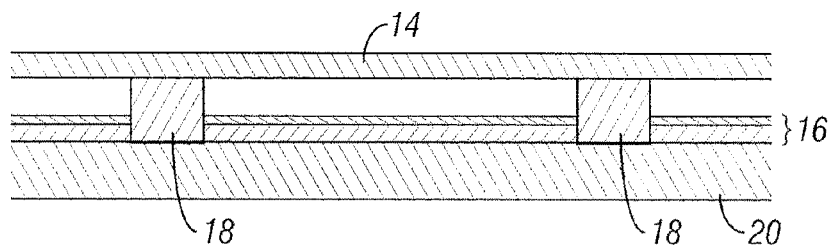
FIG. 7A is a cross section of the device of FIG. 1.
Figure 7B:
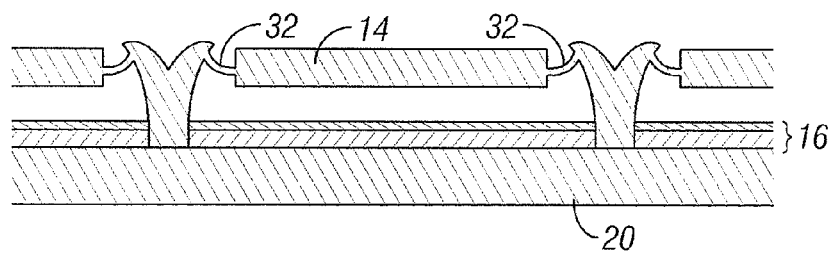
FIG. 7B is a cross section of an alternative embodiment of an interferometric modulator.
Figure 7C:
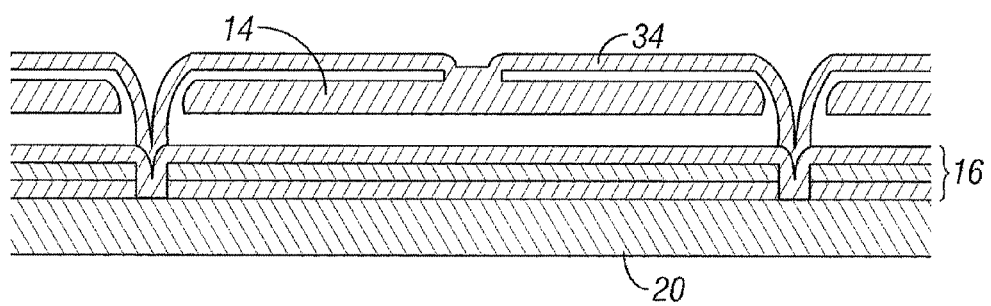
FIG. 7C is a cross section of another alternative embodiment of an interferometric modulator.
Figure 7D:
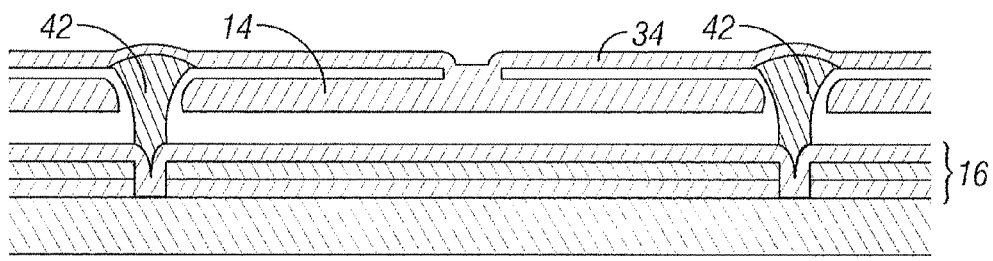
FIG. 7D is a cross section of yet another alternative embodiment of an interferometric modulator.
Figure 7E:
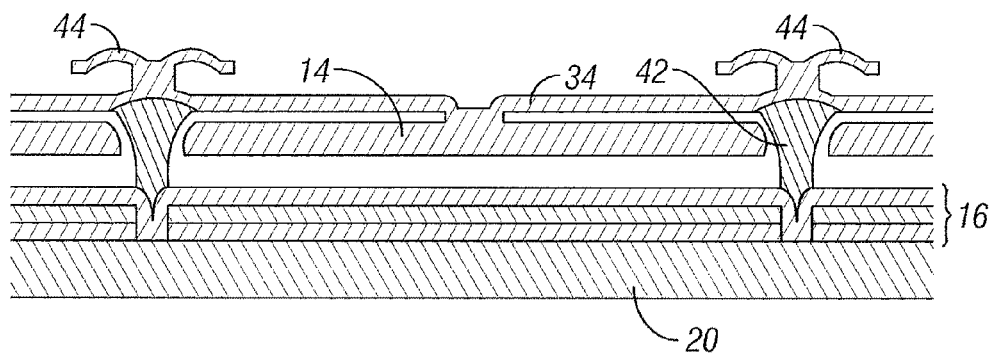
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the movable reflective layer 14 of each interferometric modulator is square or rectangular in shape and attached to supports at the corners only, on tethers 32. In FIG. 7C, the movable reflective layer 14 is square or rectangular in shape and suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the gap, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. For example, such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the movable reflective layer 14 from its mechanical properties, which are carried out by the deformable layer 34. This allows the structural design and materials used for the movable reflective layer 14 to be optimized with respect to the optical properties, and the structural design and materials used for the deformable layer 34 to be optimized with respect to desired mechanical properties.

Referring back to FIG. 1, when a potential difference is applied to a movable reflective layer 14a and the partially reflective layer (optical stack 16a), a capacitor is formed between these two layers which creates electrostatic forces that moves the movable reflective layer 14a towards the optical stack 16a and changes the shape of interferometric cavity 19. If the voltage is high enough, the reflective layer 14b is forced against the partially reflective layer 16b collapsing the cavity 19. When no potential difference is applied, however, the mechanical restoration forces of the movable reflective layer and its surrounding structure return the movable reflective layer to its original position, as illustrated by layer 14a, thereby restoring the cavity 19. Even in the undriven state, both of the layers 14a and 16b are positioned relatively close to each other, for example, about 0.2 µm.

An undesired condition known as stiction occurs when adhesion forces holding the movable layer against the optical stack are greater than the restoring force acting on the movable layer. When this occurs, the movable layer is immobilized in an actuated or an unactuated state, more commonly the actuated state. In other words, the movable layer "sticks" in a particular position which adversely affects the performance of the MEMS device. For example, with reference to FIG. 1, stiction can cause the actuated movable reflective layer 14b to remain in contact with the optical stack 16b even in the presence of a restoring force that would be expected to return the movable reflective layer 14b to a relaxed position. The restoring force includes the combined mechanical tensile stresses in the actuated movable reflective layer 14b and the structures supporting the movable layer.

Stiction is a concern for MEMS devices, including interferometric modulators, because surface adhesion forces become more significant with decreasing device dimensions and restoring forces shrink with decreasing device dimensions. Interferometric modulator devices can suffer from both manufacturing yield loss and reliability fallout as the result of stiction and/or image retention due to long term stationary image display. This phenomenon limits the usage of interferometric modulator devices to certain low use applications and causes reliability problems.

Adhesion forces that affect stiction may arise from several mechanisms including, for example, capillary forces, van der Waals force, chemical bonds and trapped charges. Adhesion forces, in varying degrees, depend on the contact area and surface separation between movable and stationary layers, for example, when a MEMS device is in the actuated state. Adhesion forces may also depend on environmental conditions including moisture present within and around the MEMS device. During the lifetime of a MEMS device, water vapor (or water) may permeate into the interior of the device and be present on the optical stack and the movable reflective layer. When these two layers are in close proximity, water vapor may cause the optical stack and the movable layer to have an additional attractive capillary force between them due to capillary water condensation. Furthermore, van der Waals force which is a short range force causing adjacent materials to become attracted at the molecular level, also can be an attractive force between the optical stack and the movable reflective layers causing the layers to stick together.

Various configurations which implement surface "roughness" structure may minimize or eliminate stiction. Examples of surface roughness configurations include bumps, dimples, grooves, and actuation rails. Some of these configurations are described, for example, in U.S. Pat. No. 6,674,562, titled INTERFEROMETRIC MODULATION OF RADIATION, which is incorporated by reference herein in its entirety. Other ways to minimize or eliminate stiction include using an anti-stiction coating on one or more of the surfaces (or sublayer surfaces) of an interferometric light modulating device so that the additional attractive forces due to events such as capillary water condensation or van der Waals forces may be minimized or eliminated. Certain examples of such anti-stiction coatings are described in patent application Ser. No. 11/119,433 filed Apr. 29, 2005, titled SYSTEM AND METHOD OF PROVIDING MEMS DEVICE WITH ANTI-STICTION COATING, now U.S. Pat. No. 7,692,839, which is incorporated by reference herein in its entirety.

MEMS devices may be tested to estimate the restoring forces provided by the combined mechanical stresses of the movable layer and support structures. Some exemplary embodiments of methods of testing MEMS devices to estimate adhesion forces are described in U.S. application Ser. No. 11/614,795, titled METHOD AND APPARATUS FOR MEASURING THE FORCE OF STICTION OF A MEMBRANE IN A MEMS DEVICE, filed on Dec. 21, 2006, now U.S. Pat. No. 7,545,556, which is incorporated by reference herein in its entirety. By testing various configurations of anti-stiction configurations (for example, bumps, dimples, grooves, support structure dimensions, and anti-stiction coatings), an optimal (or at least sufficient) configuration to avoid stiction may be identified for a particular MEMS implementation. By testing various environmental condition, and/or materials introduced to affect the environment in which the movable layer operates (for example, desiccants), the most favorable conditions and/or materials may be identified.

Stiction in a MEMS device may be minimized or eliminated by using structural support configurations that affect the amount of stiffness in the movable reflective layer. For example, increased stiffness in a movable reflective layer increases the restoring force necessary to release the movable reflective layer from a surface against which it resides. However, merely increasing the stiffness across the entire movable reflective layer may not be desired because increased stiffness implies a higher voltage which results in a closer and consistent "fit" of a larger portion of the movable reflective layer against the optical stack thereby producing more adhesion forces. Instead, certain structural support configuration embodiments can be used to increase stiffness in certain portions of the movable layer to help the movable reflective layer initiate the release process, setting off a release sequence among the plurality of modulator devices and thereby decreasing the likelihood of stiction.

The restoring force necessary to overcome the adhesion forces in the absence of electrostatic force is inversely proportional to post spacing. "Post spacing" as used herein is a broad term and refers to the distance between two adjacent "post" structures which support the movable reflective layer. The post spacing determines how much of the movable reflective layer is unsupported and thus affects the stiffness of the movable layer. Accordingly, post spacing can be considered a center-to-center distance for posts which provide a relatively small support point (for example, at a point or small circular area). However, if the post structure covers a larger support area the relevant post spacing distance is the edge post-to-post spacing between supporting structure between two adjacent posts because the nearest support point of such structures define an unsupported length of the movable reflective layer and thus affects the stiffness of the movable layer. For example, if the post structure is configured in the shape of a "Y," a "T," or an "X," and each portion of the post provides support, the relevant post spacing is considered the edge-to-edge post spacing because the edges of the posts define an unsupported portion or length of the movable reflective layer.

Figure 8:
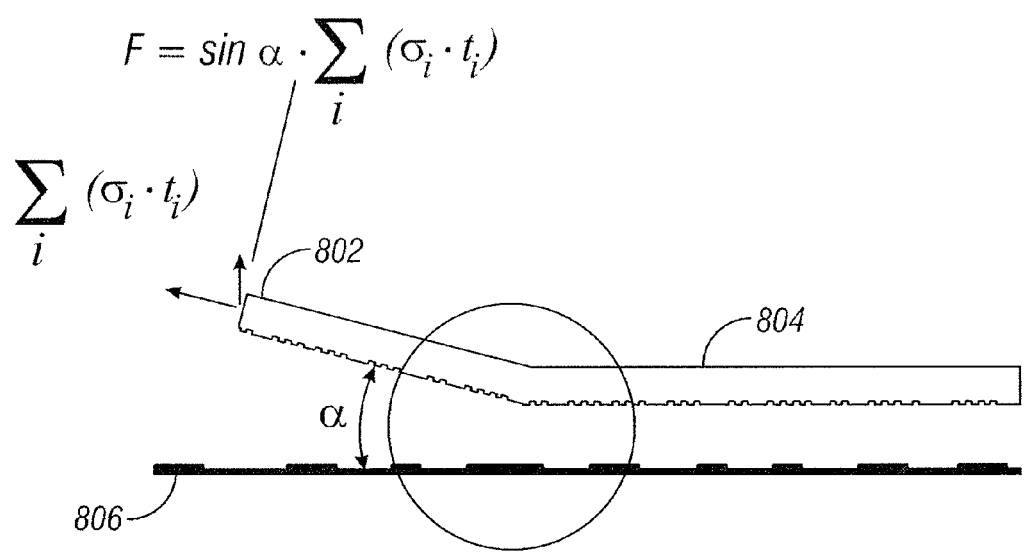
FIG. 8 is a diagram illustrating the release of an edge of movable layer of an interferometric modulator.

By reducing post spacing in interferometric modulator devices adjacent to one of the free edges of the display element, the stiffness in these devices increases, leading to a higher restoring force and more margin against adhesion forces and stiction. Upon initial release of these edge adjacent devices, subsequent release of devices that are not along the free edge of the display elements is facilitated by the restoring force from the edge adjacent devices across device boundaries. FIG. 8 is a diagram illustrating the release of an edge 802 of a membrane 804 from a surface 806. The membrane 804 may be, for example, a movable reflective layer 14*b* (FIG. 1) and the surface 806 may be optical stack 16*b* (FIG. 1). For an infinite length membrane, restoring force (F) pulling on the edge of the membrane in the actuated state is shown in equation 1:

$$F = \sin\alpha \sum_i (\sigma_i t_i) \quad [1]$$

where $\sigma_i$ is layer tensile stress, $t_i$ is layer thickness, i is any constituent of the membrane. The dominant adhesion force is a capillary attraction which has a "zipper" effect of the edge of the membrane. In other words, once the edge 802 is released from the optical stack 806, the rest of the movable reflective layer 804 requires progressively less restoring force to release from the optical stack 806 as it can be essentially peeled away from the optical stack 806 from the free edge 802 inward. A higher restoring force on the edge 802 of the membrane 804 provides more margin against stiction. Increasing stiffness in the free edge portions of a movable membrane can facilitate the release process and decrease the likelihood of stiction. Embodiments which increase stiffness in the free edge portions of a movable membrane may have many applications, including in interferometric modulators that are used in displays or other devices outside of a display.

Figure 9:
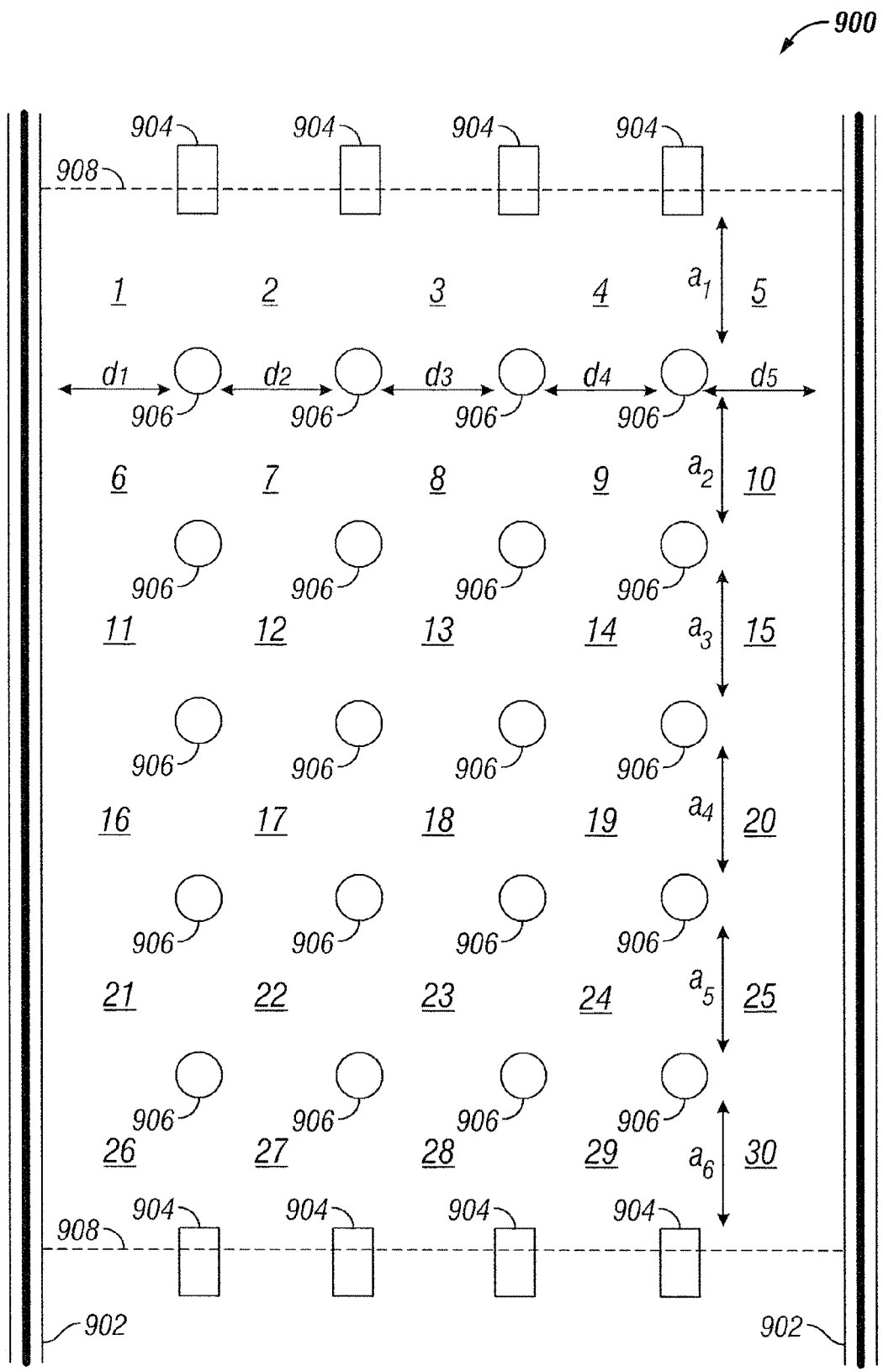
FIG. 9 is a diagram illustrating an interferometric modulator pixel having two free edges and comprising a plurality of interferometric modulator devices having consistent spacing between support posts.

FIG. 9 is a schematic illustrating a plan view of the placement of structure that supports a movable reflective layer in some examples of an interferometric modulator display pixel (or element) 900. FIG. 9 is not drawn to scale, nor are any of the other figures. The pixel 900 includes a movable layer and an optical stack which are not illustrated in FIG. 9 in order to see the rails and posts. In this embodiment, pixel 900 is configured as a rectangular-shaped pixel having one pair of opposite edges along rails 902 and another pair of opposite edges along edge posts 904. Pixel 900 may be included in a display (not shown) comprising a plurality of pixels such that one or more of the other pixels may be located adjacent to pixel 900 along one or more of the rails 902 or one or more of the edge posts 904. In such embodiments, the display may comprise a plurality of rails 902 disposed in parallel with a plurality of pixels disposed therebetween. Each pixel of the display can comprise an optical stack and a movable layer defining an interferometric cavity, where the movable layer is supported by support structure of rails 902, edge posts 904 and mid-support posts 906, wherein the perimeter outlined by the two rails 902 and edge posts 904 defines an IMOD pixel.

Figure 10:
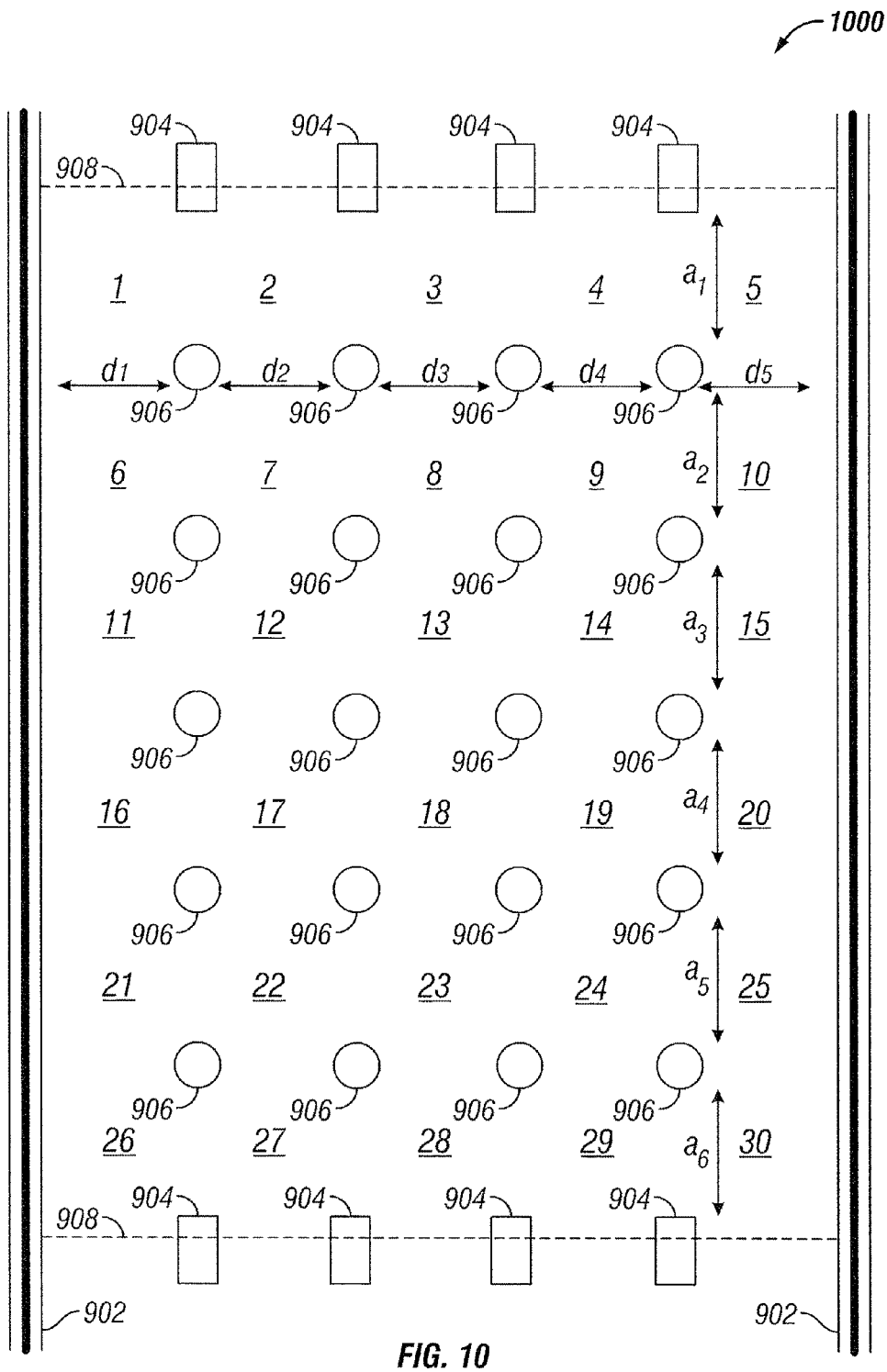
FIG. 10 is a diagram illustrating an interferometric modulator pixel embodiment having consistent post spacing distance in one direction along the free edges of the pixel and more than one post spacing distance in a second direction substantially orthogonal to the first direction.
Figure 11:
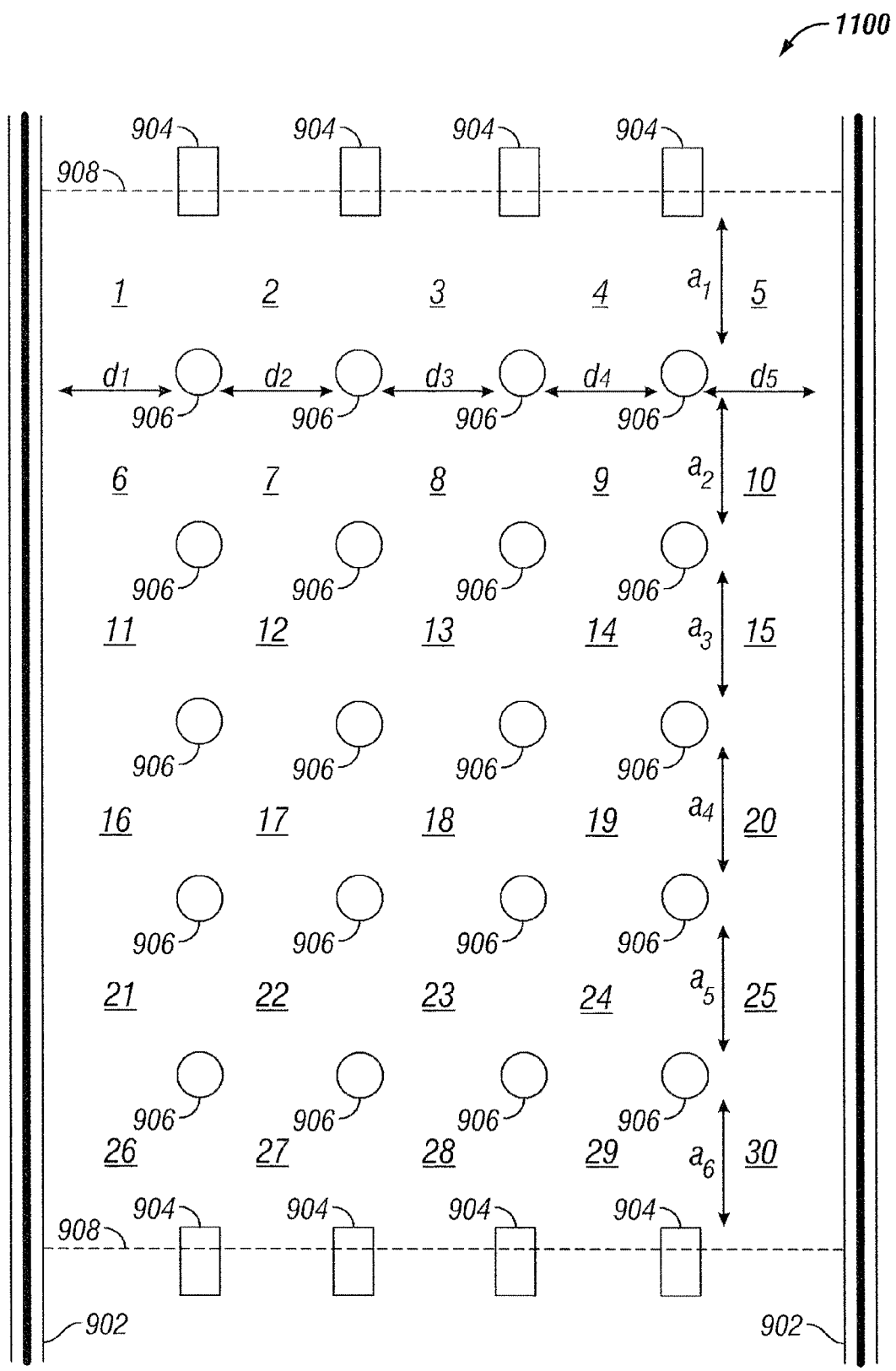
FIG. 11 is a diagram illustrating an embodiment of an interferometric modulator pixel having varied post spacing.

In this embodiment, pixel 900 comprises a 5×6 matrix of interferometric modulator devices, which are labeled 1-30 in FIG. 9 and also in subsequent FIGS. 10-11. Each of the modulator devices 1-30 in FIG. 9 comprises a portion of pixel 900 including a portion of a reflective movable layer and a portion of a partially reflective optical stack associated with pixel 900. Other pixel matrix configurations are contemplated in other embodiments and implementations. For example, in some embodiments a pixel may include a 4×5 matrix of interferometric modulators. In other embodiments, a pixel may be configured to comprise, for example, a matrix of 3×5, 3×6, 4×4, 4×6, 5×3, 6×3, 5×4, 6×5, or 6×4 interferometric modulators. The matrix of interferometric modulators may have larger or smaller dimensions such that more or fewer interferometric modulators are included in the pixel.

FIG. 9 illustrates the relative placement of certain structure including rails and posts that support a movable layer of pixel 900. The movable layer nor the substrate are shown in FIG. 9 in order to better illustrate the support structure (for example, edge posts 904, middle support posts 906, and rails 902) that support and separate the movable layer from the optical stack. Pixel 900 comprises interferometric modulating structure including a partially reflective optical stack, a movable reflective layer, and support structure (for example, rails and posts) which can operate as described above in reference to FIGS. 1-7*e*. In this embodiment, the movable reflective layers of the modulator devices 1-30 are configured to be driven and operate together. The movable reflective layers of modulator devices 1-30 may be electrically connected. Also, the partially reflective optical stacks of modulator devices 1-30 may be electrically connected. In this embodiment, when pixel 900 is driven to an actuated or released state, all of the modulator devices 1-30 of pixel 900 are driven to that actuated or released state such that they all achieve the same state (either actuated or released) after each write cycle. In some embodiments movable reflective layers and/or the optical stacks of the modulator devices 1-30 may not all be electrically connected but can be driven to operate together.

The movable layer and the optical stack 910 are both disposed between two edge rails 902 and a plurality of edge posts 904 as illustrated in FIG. 9. The rails 902 are connected to two opposite edges of the movable reflective layer of the pixel 900, and the edge posts 904 are disposed on the other two non-rail edges of pixel 900. The rails 902 support the movable layer along the edges of pixel 900 separate it from a partially reflective optical stack 910. The edge posts 904 are connected to a portion of the movable reflective layer of pixel 900 at its edges to support the movable layer and separate in from the optical stack 910. Two of the edges of the movable layer of pixel 900 are connected (or at least substantially connected)

to the rails 902. Portions of two of the other edges of the movable layer of pixel 900 are connected to edge posts 904 such that at least a portion of these edges of the movable layer are unsupported or "free." Accordingly, each of the two edges of the movable layer that are supported by edge posts may be referred to herein as a "free edge" 908. The pixel 900 also comprises a plurality of mid-support posts 906. The embodiment in FIG. 9 illustrates twenty (20) mid-support posts 906 that support the movable reflective layer of pixel 900. The number of mid-support posts 906 may vary for other embodiments and can be affected by the number of interferometric devices in the pixel.

In an embodiment shown in FIG. 9, the distance in a first direction between a first mid-support post and an adjacent mid-support post is illustrated as post spacing distances $d_2$, $d_3$, and $d_4$. The distances between mid-support posts 906 and adjacent rails 902 in the first direction are illustrated as distances $d_1$ and $d_5$, and the first direction is indicated by the associated horizontal double-ended arrows. The post spacing distances between two adjacent mid-support posts 906 along a second direction are illustrated by $a_2$, $a_3$, $a_4$, and $a_5$. The distances between mid-support posts and adjacent edge posts 904 in the second direction are illustrated as distances $a_1$ and $a_6$, and the second direction is indicated by the associated vertical double-ended arrows. In this embodiment, the second direction is at least substantially orthogonal to the first direction.

Still referring to FIG. 9, some embodiments of pixel 900 have consistent post spacing distances ($a_2$, $a_3$, $a_4$, and $a_5$) between the adjacent mid-support posts 906 in the second direction which is the same as the post spacing distances ($a_1$ and $a_6$) between mid-support posts and edge posts. In other words, $a_1=a_2=a_3=a_3=a_4=a_5=a_6$. The post spacing distances in the first direction may also be consistent (for example, $d_1=d_2=d_3=d_3=d_4=d_5$).

To increase stiction margin, in some embodiments the posts that support a movable reflective layer can be positioned such that the stiffness of the movable reflective layer at or near the free edge is greater than the stiffness of other portions of the movable reflective layer. Such embodiments allow the movable layer to be moved away from the optical stack starting with the free edge in the manner illustrated in FIG. 8. In other words, when driven to release, the free edge of the movable layer releases from the optical stack first, which facilitates the release of the remaining portion of the movable reflective layer. Referring again to FIG. 9, the stiffness of the movable reflective layer can also be affected by the distance between support posts in the first direction, for example, the distance between two mid-support posts 906 or a mid-support post 906 and a rail 902. In certain embodiments this too can reduce stiction. However, the rails 902 are connected to a large portion (if not all) of the adjacent edges of the movable reflective layer such that the mechanical behavior during a release state of the movable layer along the connected edge will be different than along the free edge of the movable layer.

Embodiments described herein illustrate examples of varying post distance spacing to affect the stiffness of the movable layer. In one embodiment, the pixel 900 is configured such that the stiffness of the movable layer along the edge posts 904 is no less than a first stiffness value and the stiffness of any other portion of the movable layer is no greater than a second stiffness value, the first stiffness value being higher than the second stiffness value. For example, in some embodiments, the pixel 900 can be configured so the one or more of the distances between the edge posts 904 and the adjacent mid-support posts 906 (for example, $a_1$ and $a_6$) is less than the distance between mid-support posts 906 that are non-adjacent to the free edge (for example, mid-support posts separated by post spacing distance $a_4$). In other words, the post spacing distance $a_1$ and/or $a_6<a_4$. Other embodiments of increasing the stiffness in the portion of the free edge of a movable layer so as to prevent stiction are described below.

FIG. 10 is a schematic illustrating a plan view of an embodiment of a display pixel 1000 where post spacing distances are varied to increase stiffness in a movable layer along a free edge of pixel 1000 relative to the stiffness in other portions of the movable layer. Similarly to FIG. 9, pixel 1000 includes modulator devices 1-30 and a movable reflective layer and an optical stack disposed between and connected to the rails 902 and the edge posts 904. The movable layer and the optical stack are not shown in FIG. 10 for clarity of illustrating support structure spacing. The movable layer has free edges along the two sets of edge posts 904, where the other two edges are connected to the rails 902. The post spacing distances $d_1$, $d_2$, $d_3$, and $d_4$ in the first direction along the free edges of the pixel 1000 are the same. Here, $a_1$ and $a_6$ illustrate the post spacing distance between edge posts 904 and adjacent mid-support posts 906. The mid-support posts 906 are separated by post spacing distances $a_2$, $a_3$, $a_4$ and $a_5$ which are substantially equal. In this embodiment, one or both of post spacing distances $a_1$ and $a_6$ in the second direction can be less than the post spacing distances $a_2$, $a_3$, $a_4$ and $a_5$ of the mid-support posts 906. In some embodiments, the post spacing distance of $a_1$ and/or $a_6$ is between about 1 µm and about 10 µm less than the post spacing between the mid-support posts 906 (for example, $a_4$). In some embodiments, the post spacing distance of $a_1$ and/or $a_6$ is between about 3 µm and about 7 µm less than $a_2$, $a_3$, $a_4$ and $a_5$, and in other embodiments the post spacing distance of $a_1$ and/or $a_6$ is about 5 µm less than $a_2$, $a_3$, $a_4$ and $a_5$. For example, in some embodiments the distance between one or more edge post 904 and one or more mid-support posts 906 adjacent to the one or more edge posts (for example, $a_1$ and/or $a_6$) is about 32 µm, and the distance between mid-support posts (for example, $a_4$) is about 38 µm.

FIG. 11 is a diagram illustrating a support structure embodiment of interferometric modulator pixel 1100 which comprises rails 902, edge posts 904, and mid-support posts 906. Similarly to FIGS. 9 and 10, pixel 1100 includes a reflective movable layer and the optical stack disposed between the rails 902 and the edge posts 904 but they are not shown here in order to more clearly show the structural support elements. In this embodiment, the pixel 1100 has post spacing in the second direction (again indicated by $a_1$-$a_6$) that is closer near the free edge of the movable layer (along the edge posts 904) than in other portions of the movable reflective layer. In this embodiment, the post spacing in the second direction decreases from the center of pixel 1100 to the edge of pixel 1100. For example, post spacing $a_1$ is less than $a_2$ which is less than $a_3$ (e.g., $a_1<a_2<a_3$). Both sides of the pixel 1100 may exhibit this type of post spacing such that $a_6$ is less than $a_5$ which is less than $a_4$ (e.g., $a_6<a_5<a_4$). Such an embodiment increases the stiffness on the movable reflective layer at its free edges along edge posts 904. For example, in some embodiments the post spacing distance $a_1$ and $a_6$ can be about 32 µm, $a_2$ and $a_5$ can be about 35 µm, and $a_3$ and $a_4$ can be about 38 µm. When a restoring force is applied to this embodiment, the movable reflective layer releases from the free edges first which helps to release the remaining portions of the movable reflective layer.

Figure 12:
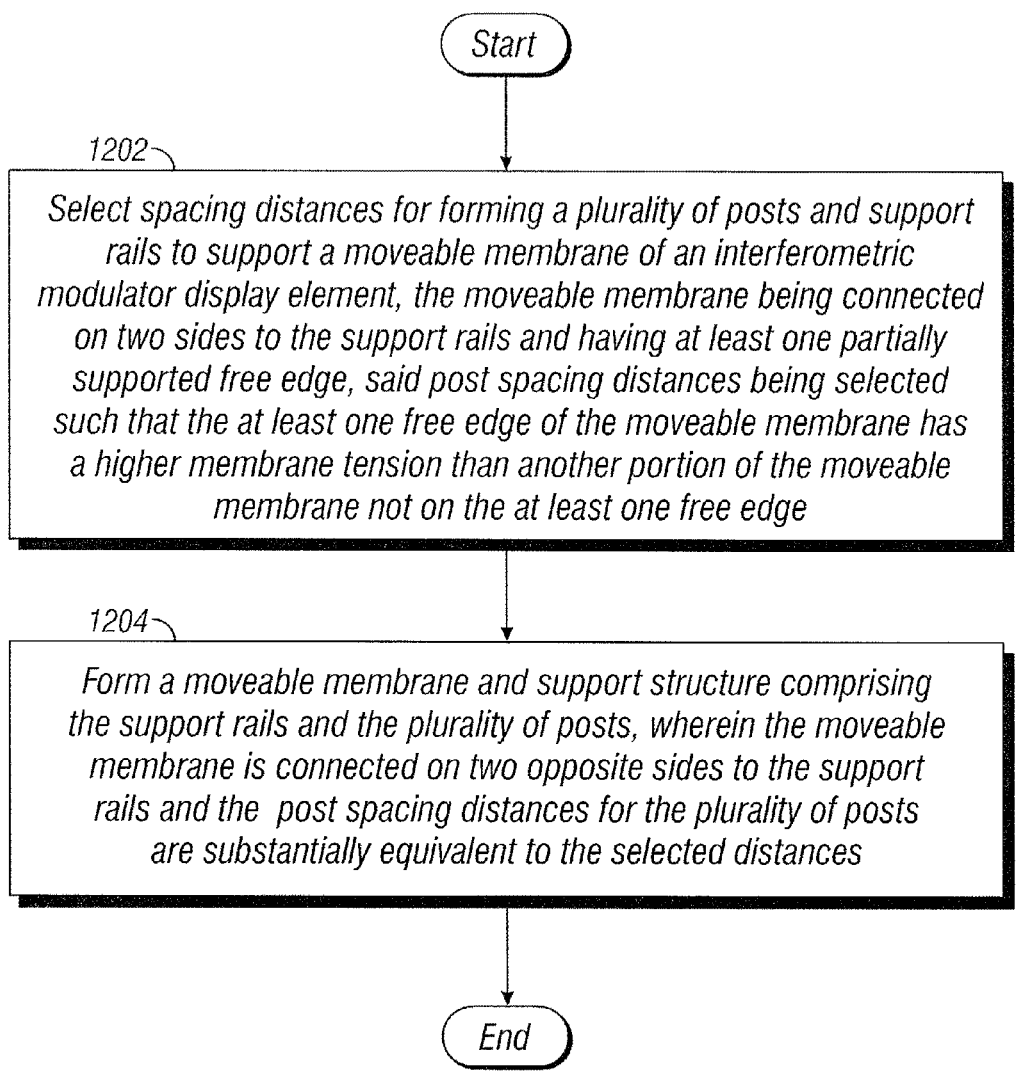
FIG. 12 is a flowchart illustrating an embodiment of manufacturing an interferometric modulator display element.

FIG. 12 is a flowchart illustrating another embodiment of a method of manufacturing a interferometric modulator display element which can be, for example, the pixel illustrated in FIGS. 9-11. Referring to FIG. 12 step 1202, the display element is made by selecting post spacing distances for forming a plurality of posts and support rails to support a movable layer of an interferometric modulator display element, the movable layer being connected on two sides to the support rails and having at least one partially supported free edge, said post spacing distances being selected such that the at least one free edge of the movable layer has a higher layer stiffness than another portion of the movable layer not on the at least one free edge. Determining proper post spacing can involve testing various post spacing embodiments that affect the stiffness of the movable layer, estimating adhesion forces and also considering other anti-stiction embodiments (for example, bumps, dimples, groves, and anti-stiction coatings).

Still referring to FIG. 12, at step 1204 a movable layer is formed comprising support rails and a plurality of posts, wherein the movable layer is connected on two opposite sides to the support rails and to the plurality of posts, and wherein the post spacing distances for the plurality of posts is substantially equivalent to the selected spacing distances. The movable layer and support structure may be formed similarly to the movable layers 14a, 14b and posts 18 described in reference to FIG. 1.

Figure 13:
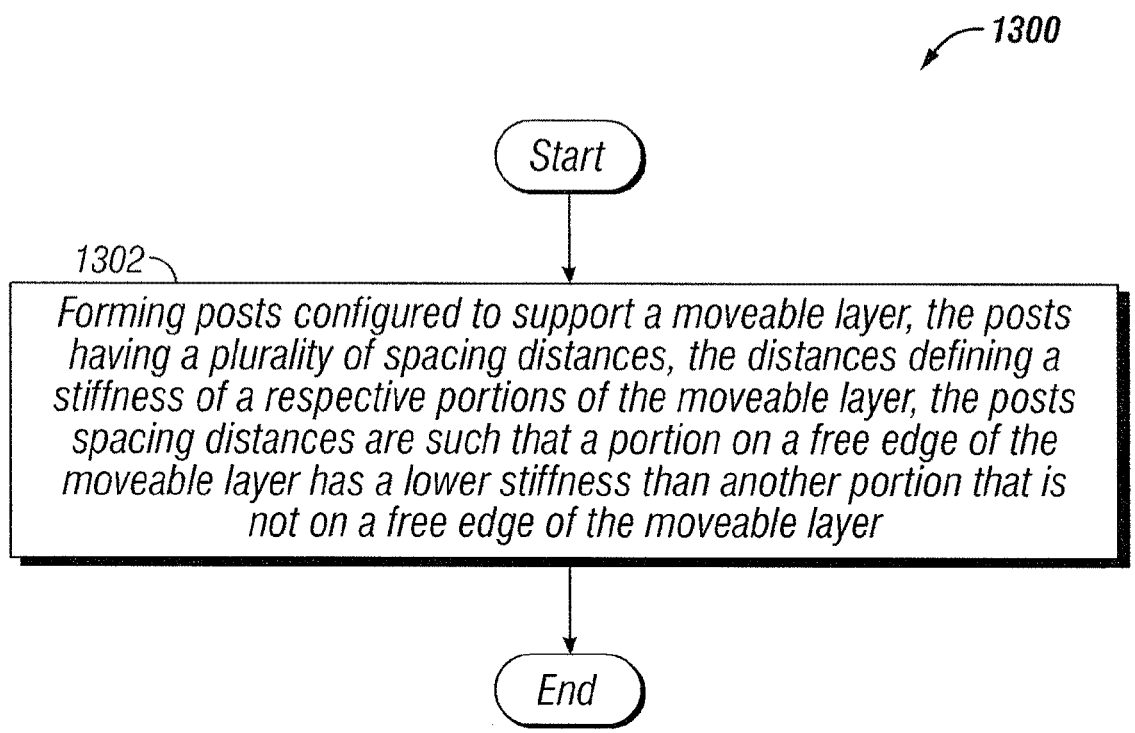
FIG. 13 is a flowchart illustrating an embodiment of manufacturing an interferometric modulator display element.

Interferometric modulators can be manufactured in accordance with the above-described embodiments. For example, FIG. 13 is a flowchart that illustrates a process 1300 of manufacturing an interferometric modulator. At process step 1302, the process 1300 includes forming posts configured to support a movable layer, the posts having a plurality of post spacing distances, the distances defining a stiffness of respective portions of the movable layer, wherein the post spacing distances are such that a portion on a free edge of the movable layer has a lower stiffness than another portion that is not on a free edge of the movable layer. The process 1300 may define the post spacing distance between a first set of two adjacent posts aligned in a direction about normal to the free edge, and disposed closest to the free edge, of the movable layer to be approximately 2-10 microns smaller than a post spacing distance between a second set of two adjacent posts that are disposed farther away from the free edge than the first set of adjacent posts. In certain examples, the process 1300 defines a post spacing distance between a first set of two adjacent posts aligned in a direction about normal to the free edge, and closest to the free edge, of the movable layer can be defined to be approximately 32 microns. In other examples, the process 1300 defines a post spacing distance between a second set of two adjacent posts, disposed farther away from the free edge than the first set of adjacent posts, to be approximately 38 microns. In some examples, a post spacing distance between a first set of two adjacent posts aligned in a direction about normal to the free edge and disposed closest to the free edge defines a stiffness of a first portion of the movable layer that is higher than a stiffness of the movable layer defined by a second set of two adjacent posts that are disposed farther away from the free edge than the first set of adjacent posts.

A wide variety of variation is possible for the above-described exemplary embodiments. Films, layers, components, and/or elements may be added, removed, or rearranged. Additionally, processing steps may be added, removed, or reordered. Also, although the terms film and layer have been used herein, such terms as used herein include film stacks and multilayers. Such film stacks and multilayers may be adhered to other structures using adhesive or may be formed on other structures using deposition or in other manners.

The example embodiments described above are merely exemplary and those skilled in the art may now make numerous uses of, and departures from, the above-described examples without departing from the inventive concepts disclosed herein. The word "exemplary" is used exclusively herein to mean "serving as an example, instance, or illustration." Any example described herein as "exemplary" is not necessarily to be construed as preferred or advantageous over other examples. Various modifications to these examples may be readily apparent to those skilled in the art, and the generic principles defined herein may be applied to other examples without departing from the spirit or scope of the novel aspects described herein. Thus, the scope of the disclosure is not intended to be limited to the examples shown herein but is to be accorded the widest scope consistent with the principles and novel features disclosed herein.

The foregoing description details certain embodiments of the invention. It will be appreciated, however, that no matter how detailed the foregoing appears in text, the invention can be practiced in many ways. As is also stated above, it should be noted that the use of particular terminology when describing certain features or aspects of the invention should not be taken to imply that the terminology is being re-defined herein to be restricted to including any specific characteristics of the features or aspects of the invention with which that terminology is associated.

What is claimed is:

1. A display element comprising:
    a plurality of interferometric modulator devices configured in a matrix forming a plurality of rows and columns, each interferometric modulator device comprising
    a movable reflective layer comprising two opposite edges that are each supported by a rail and two opposing free edges; and
    a plurality of posts configured to support the movable reflective layer, the plurality of posts being spaced apart to define post spacing distances between adjacent posts positioned along an axis parallel to one of the rails, wherein the post spacing distance between adjacent posts along the axis and closest to each free edge is smaller than the post spacing distance between a plurality of other adjacent posts along the axis.

2. The display element of claim 1, wherein the post spacing distances between said plurality of other adjacent posts along the axis are substantially the same.

3. The display element of claim 1, wherein the post spacing distances between the adjacent posts along the axis and closest to the respective free edges are substantially the same.

4. The display element of claim 1, wherein the post spacing distances between adjacent posts along the axis increase as the distance from one of the free edges increases.

5. The display element of claim 4, wherein the post spacing distance between said plurality of other adjacent posts along the axis is approximately 38 µm.

6. The display element of claim 1, wherein the post spacing distance between the adjacent posts along the axis and closest to each free edge is approximately 32 µm.

7. The display element of claim 1, wherein the post spacing distance between the adjacent posts along the axis and closest to each free edge is approximately 2-10 µm smaller than the post spacing distance between said plurality of other adjacent posts along the axis.

8. The display element of claim 1, wherein the defined post spacing distances minimize a voltage required to release the interferometric modulator device.

9. The display element of claim 1, wherein the post spacing distances are defined such that at least one free edge of the movable reflective layer has a higher stiffness than another portion of the movable reflective layer that is not on the at least one free edge.

10. A system comprising:
- a display comprising a plurality of display elements of claim 1;
- a processor that is configured to communicate with said display, said processor being configured to process image data; and
- a memory device that is configured to communicate with said processor.

11. The system as recited in claim 10, further comprising a driver circuit configured to send at least one signal to said display.

12. The system as recited in claim 11, further comprising a controller configured to send at least a portion of said image data to said driver circuit.

13. The system as recited in claim 10, further comprising an image source module configured to send said image data to said processor.

14. The system as recited in claim 13, wherein said image source module comprises at least one of a receiver, transceiver, and transmitter.

15. A display element comprising:
- a plurality of interferometric modulator devices configured in a matrix forming a plurality of rows and columns, each interferometric modulator device comprising
  - a movable reflective layer comprising two opposite edges that are each supported by a rail and two opposing free edges, and
  - a plurality of posts configured to support the movable reflective layer, the plurality of posts being spaced apart to define post spacing distances between adjacent posts positioned along an axis parallel to one of the rails, wherein an outer post spacing distance between two adjacent outer posts along the axis is smaller than an inner post spacing distance between two adjacent inner posts along the axis, where the outer posts are closer to a free edge than the inner posts.

16. The display element of claim 15, wherein the post spacing distances between a plurality of adjacent inner posts along the axis are substantially the same.

17. The display element of claim 15, wherein the post spacing distances between the adjacent outer posts close to the respective free edges are substantially the same.

18. The display element of claim 15, wherein the post spacing distances between adjacent inner posts along the axis increase as the distance from one of the free edges increases.

19. The display element of claim 15, wherein the post spacing distance between two adjacent outer posts along the axis and closest to each free edge is approximately 32 μm.

20. The display element of claim 15, wherein the post spacing distance between two adjacent inner posts along the axis is approximately 38 μm.

21. The display element of claim 15, wherein the post spacing distance between two adjacent outer posts along the axis and closest to each free edge is approximately 2-10 μm smaller than the post spacing distance between two adjacent inner posts along the axis.

* * * * *